United States Patent
Laighton et al.

(10) Patent No.: US 9,577,303 B2
(45) Date of Patent: Feb. 21, 2017

(54) MICROWAVE ATTENUATOR MODULE

(71) Applicant: Raytheon Company, Waltham, MA (US)

(72) Inventors: Christopher M. Laighton, Boxborough, MA (US); Michael T. Borkowski, Bedford, NH (US)

(73) Assignee: RAYTHEON COMPANY, Waltham, MA (US)

( * ) Notice: Subject to any disclaimer, the term of this patent is extended or adjusted under 35 U.S.C. 154(b) by 64 days.

(21) Appl. No.: 14/609,585

(22) Filed: Jan. 30, 2015

(65) Prior Publication Data

US 2016/0226119 A1  Aug. 4, 2016

(51) Int. Cl.
*H01P 1/22* (2006.01)
*G01R 27/28* (2006.01)
*G01R 31/02* (2006.01)
*H01P 1/26* (2006.01)

(52) U.S. Cl.
CPC .............. *H01P 1/227* (2013.01); *G01R 27/28* (2013.01); *G01R 31/02* (2013.01); *H01P 1/268* (2013.01)

(58) Field of Classification Search
CPC ....................................................... H01P 1/227
USPC ............................................. 333/81 A, 22 R
See application file for complete search history.

(56) References Cited

U.S. PATENT DOCUMENTS

| 5,768,109 A | 6/1998 | Gulick et al. |
| 6,118,357 A * | 9/2000 | Tomasevic ............. H01L 23/66 257/664 |
| 2008/0272865 A1* | 11/2008 | Chen ................... H03G 1/0041 333/81 R |
| 2014/0210538 A1* | 7/2014 | Jordan ..................... H03H 7/25 327/308 |

OTHER PUBLICATIONS

U.S. Appl. No. 14/641,939, filed Mar. 9, 2015, Laighton, et al.
U.S. Appl. No. 14/641,939; Responses to Office Action filed on Jul. 25, 2016 and Aug. 8, 2016.
Office Action dated May 13, 2016, U.S. Appl. No. 14/641,939, 16 pages.
Response to Office Action dated May 13, 2016, filed Jul. 25, 2016, U.S. Appl. No. 14/641,939, 8 pages.

* cited by examiner

*Primary Examiner* — Stephen E Jones
*Assistant Examiner* — Scott S Outten
(74) *Attorney, Agent, or Firm* — Daly, Crowley, Mofford & Durkee, LLP

(57) ABSTRACT

An attenuator module having a substrate; a attenuator disposed on one surface of the substrate, the attenuator having an input terminal at one end of the attenuator and an output terminal at an opposite end of the attenuator; an electrical conductor disposed on an opposite surface of the substrate; and an electrically conductive via passing from the output terminal through the substrate to the electrical conductor disposed on the opposite surface of the substrate.

10 Claims, 8 Drawing Sheets

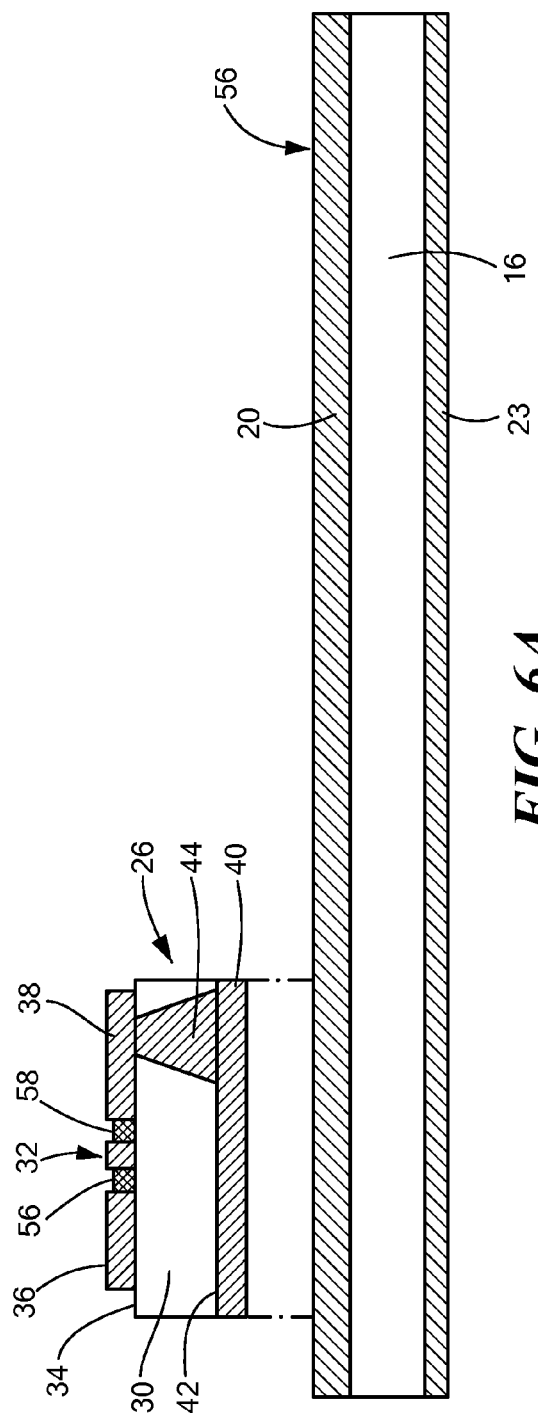
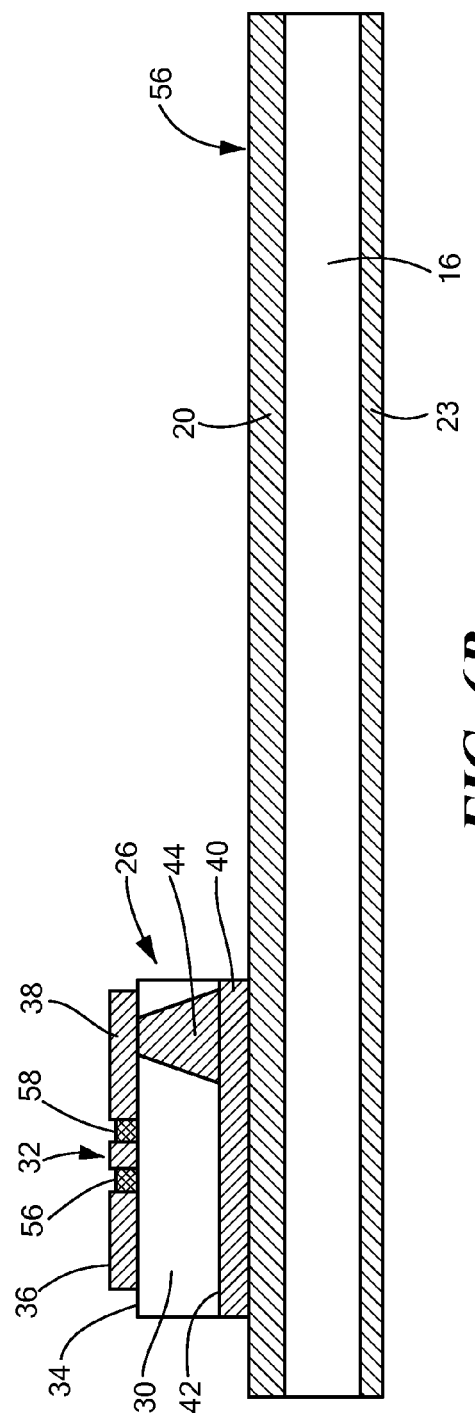

MICROWAVE ATTENUATOR MODULE

TECHNICAL FIELD

This disclosure relates generally to microwave attenuator modules and more particularly to microwave attenuator modules that are easily mountable to and easily removable from a microwave transmission line.

BACKGROUND

As is known in the art, many microelectronic circuits, particularly circuits that include amplifiers, as shown in FIG. 1A, sometimes during the design and fabrication process the installation of an attenuator, such as a broadband T-shaped attenuator as shown in FIGS. 1C-1E is sometimes required at some point along the signal path (sometimes referred to as the strip conductor or signal line, FIG. 1A) of a microstrip microwave transmission line. More particularly, the microstrip microwave transmission line includes the signal line separated from a circuit ground plane conductor by a substrate, as shown in FIG. 1A, and is used to interconnect a pair of amplifiers. It should be understood that if the microwave transmission line were a coplanar waveguide (CPW) microwave transmission line having the signal line disposed on the upper surface of a substrate and disposed between, and coplanar with, a pair of ground plane conductors, at least one of the coplanar ground plane conductors would be connected to the circuit ground plane with a conductive via passing through the substrate between the coplanar ground plane conductor of the CPW and the circuit ground plane conductor on the bottom surface of the substrate.

The attenuator has a pair of series resistive elements, disposed on an upper surface of a substrate, serially connected between an input pad and an output pad, and a shunt resistive element, also disposed on the upper surface of the substrate, connected between a junction between the pair of serially connected resistive elements and a shunt element pad. The shunt element pad is connected to an attenuator ground plane conductor disposed on the bottom surface of the attenuator substrate through a conductive via, as shown in FIGS. 1C-1E. The shunt element pad must be connected to the circuit ground plane conductor (which also serves as a DC ground connection) shown in FIG. 1B and therefore, the shunt elements pad, being connected to DC ground, must not be connected to the downstream amplifier input. Thus, as shown in FIG. 1B, when mounting the T-shaped attenuator to the signal line, FIG. 1B in order to prevent the shunt resistive element from being connected to the input of the downstream amplifier and also to enable the shunt element pad to be connected to the circuit ground plane conductor, a gap is formed in the signal line where an attenuator is to be installed, as shown in FIG. 1B. Thus, a via is formed through the substrate in a region between the signal line under the attenuator to the underlying circuit ground plane conductor, as shown in FIG. 1B. It would be describable to optimize the optimal point along the signal line for installation of the attenuator. Thus, using this gap approach the signal line has been permanently changed and thereby making installation of the attenuator at a different position along the signal line difficult. To put it another way, after creation of the gap and installation of the attenuator, testing may determine that the attenuator has not been installed at the optimum position. This gap approach has, however, permanently changed the signal line thereby making difficult to go back and change the position of the gap along the signal line where the attenuator is to be re-installed in order to obtain optimal performance. This results in costly amplifier rework and often means the replaced amplifiers have to be handpicked to make sure the signal level is corrected. This can make a major impact on a production line.

SUMMARY

In accordance with the disclosure, an attenuator module is provided, comprising: a substrate; an attenuator disposed on one surface of the substrate, the attenuator having an input terminal at one end of the attenuator and an output terminal at an opposite end of the attenuator; an electrical conductor disposed on an opposite surface of the substrate; and an electrically conductive via passing from the output terminal through the substrate to the electrical conductor disposed on the opposite surface of the substrate.

With such an arrangement, an attenuator module is provided having metallization to make it easily implemented in existing circuits. The output of the circuit is passed from the top side metal to the backside metal using a conductive via. The backside is then electrically attached to the target signal layer using conductive epoxy. Thus, the module may be easily installed at different levels of attenuation along the signal line to evaluate the impact to these critical electrical parameters. The attenuators can be easily removed and replaced to try multiple values and configurations. The results of these tests greatly reduce the risk of error in subsequent iteration of the design. A second benefit from such module is to give an option to production hardware that is not specification compliant due to high levels of gain. An alternate configuration of the production hardware can be determined. The implementation uses standard assembly process and eliminates rework (and collateral damage), gain binning (handpicking amplifiers) and scrapped hardware.

In one embodiment, an electrical circuit is provided having a first substrate having a microwave transmission line, the microwave transmission line having: a signal conductor disposed on a surface of the first substrate; and a ground plane conductor. An attenuator module is provided having: a second substrate; an attenuator disposed on one surface of the second substrate, the attenuator having an input terminal at one end of the attenuator and an output terminal at an opposite end of the attenuator; an electrical conductor disposed on an opposite surface of the second substrate; and an electrically conductive via passing from the is output terminal through the second substrate to the electrical conductor disposed on the opposite surface of the second substrate. The electrical conductor is disposed on an opposite surface of the second substrate is disposed in electrical contact with the signal conductor of the first substrate.

In one embodiment, an electrical circuit is provided having a monolithic microwave integrated circuit having an amplifier. A substrate is provided having a microwave transmission line, the microwave transmission line having: a signal conductor disposed on a surface of the first substrate and connected to the amplifier; and a ground plane conductor. An attenuator module includes: a second substrate; an attenuator disposed on one surface of the second substrate, the attenuator having an input terminal at one end of the attenuator and an output terminal at an opposite end of the attenuator; an electrical conductor disposed on an opposite surface of the second substrate; and an electrically conductive via passing from the output terminal through the second substrate to the electrical conductor disposed on the opposite surface of the second substrate. The electrical conductor is disposed on an opposite surface of the second substrate is disposed in electrical contact with the signal conductor of the first substrate.

In one embodiment, a method is provided for determining placement of an attenuator module along a signal path on a first substrate having a microwave transmission line, the microwave transmission line having: a signal conductor disposed on a surface of the first substrate to provide the signal path; and a ground plane conductor. The method includes: (A) providing an attenuator module, comprising: a second substrate; an attenuator disposed one surface of the second substrate, the attenuator having an input terminal at one end of the attenuator and an output terminal at an opposite end of the attenuator; an electrical conductor disposed on an opposite surface of the second substrate; and an electrically conductive via passing from the output terminal through the second substrate to the electrical conductor disposed on the opposite surface of the second substrate, the electrical conductor disposed on an opposite surface of the second substrate being disposed in electrical contact with the signal conductor of the first substrate; (B) disposing the attenuator module at a first position along the signal conductor comprising disposing the electrical conductor on the opposite surface of the second substrate at a first position on the signal conductor; (C) testing performance of transmission along the signal path through the disposed attenuator module; (D) changing the position of the attenuator module along the signal path; and (E) re-testing performance of transmission along the signal path through the re-positioned attenuator module.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIG. 6A is a cross-sectional, exploded view of the attenuator module of FIG. 3 mounted to the microwave transmission line used to interconnect the amplifiers in the circuit of FIG. 2, the cross section being taken along line 6A, 6B-6A, 6B in FIG. 5; and FIG. 6B is a cross-sectional, assembled view of the attenuator module of FIG. 3 mounted to the microwave transmission line used to interconnect the amplifiers in the circuit of FIG. 2, the cross section being taken along line 6A, 6B-6A, 6B in FIG. 5.

Like reference symbols in the various drawings indicate like elements.

DETAILED DESCRIPTION

Figure 1A:
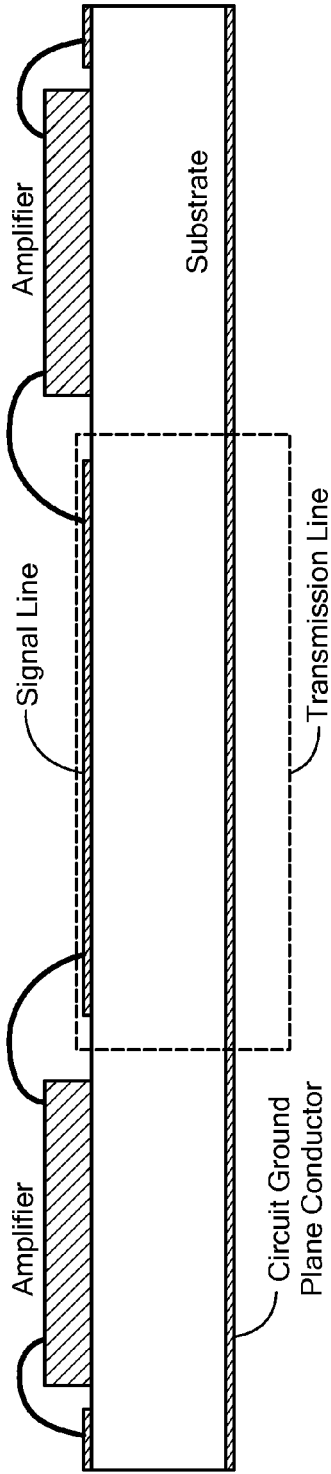
FIGS. 1A and 1B are electrical circuits used to interconnect a pair of amplifies according to the PRIOR ART.
Figure 1B:
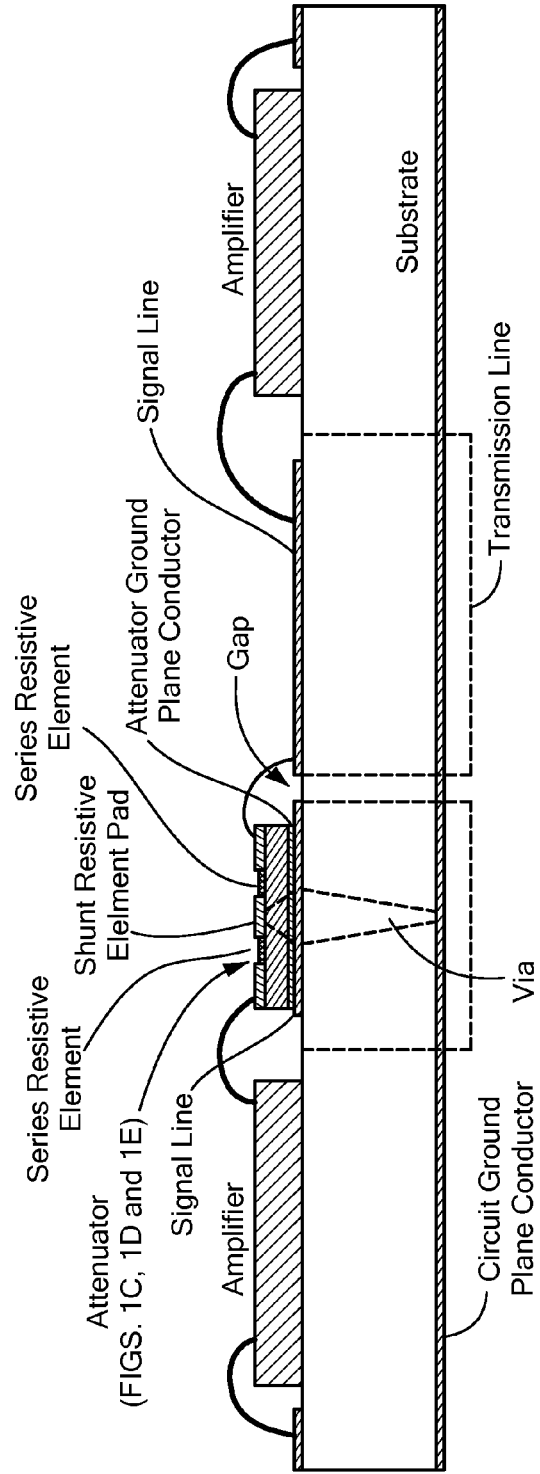
Figure 1C:
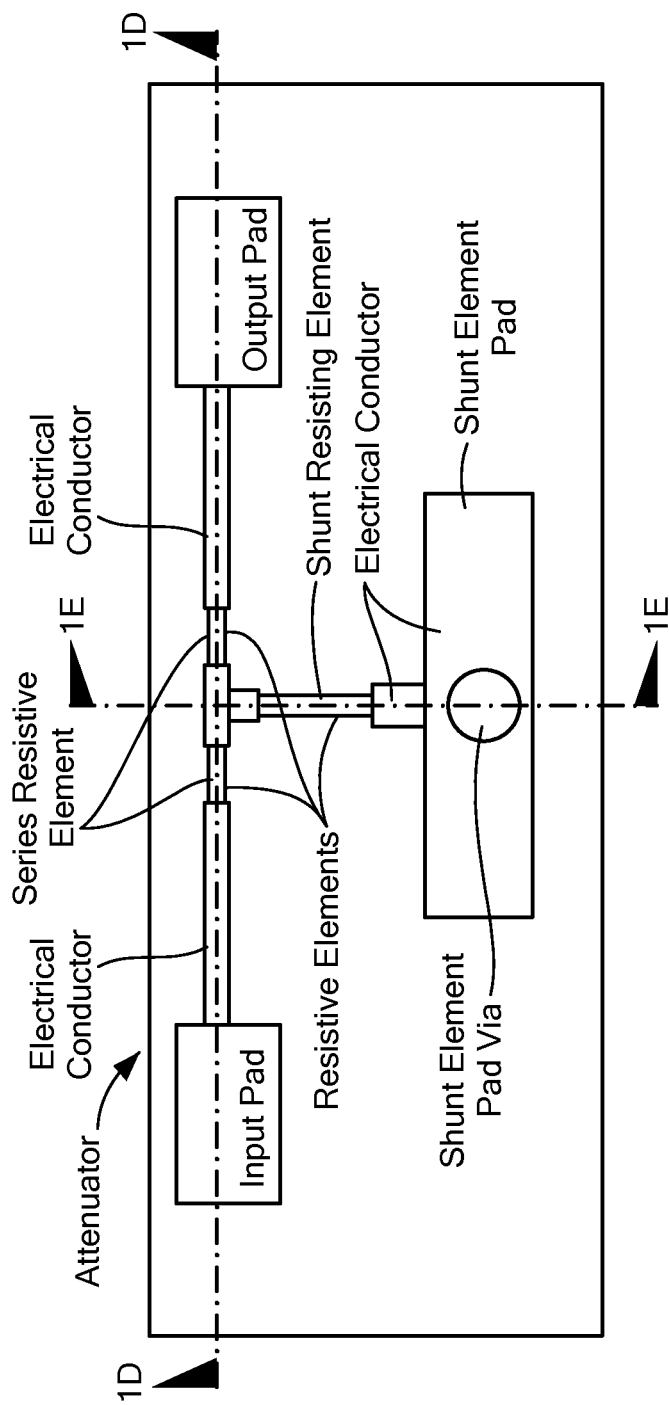
FIG. 1C is a plane view of a T-shaped attenuator according to the PRIOR ART.
Figure 1D:
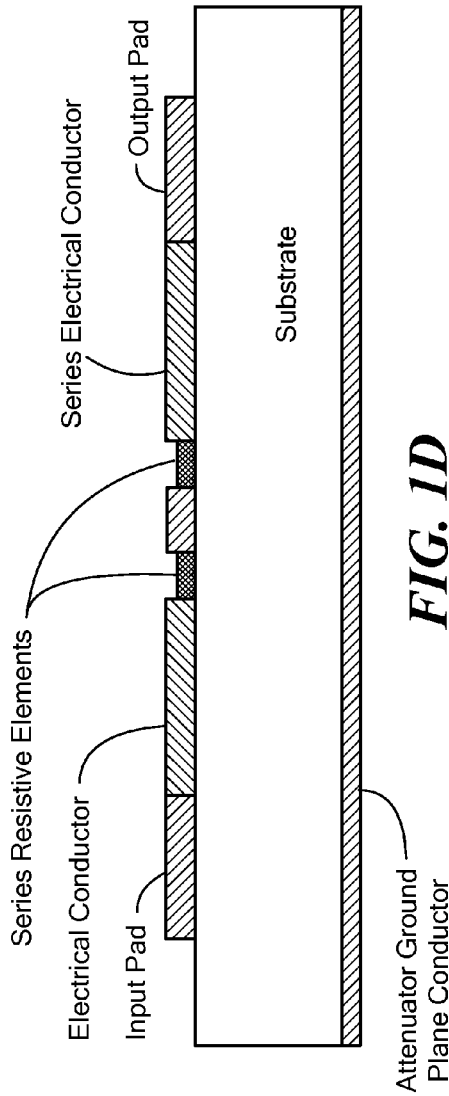
FIGS. 1D and 1E are cross sectional views of the attenuator FIG. 1C according to the PRIOR ART, FIG. 1D being taken along line 1D-1D in FIG. 1C and FIG. 1E being taken along line 1E-1E in FIG. 1C.
Figure 1E:
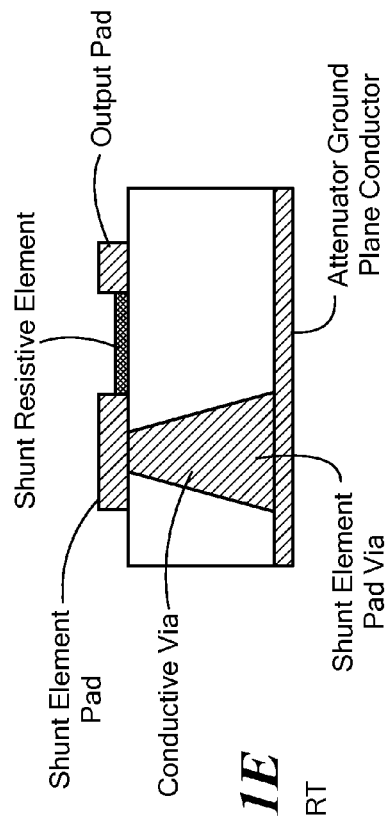
Figure 2:
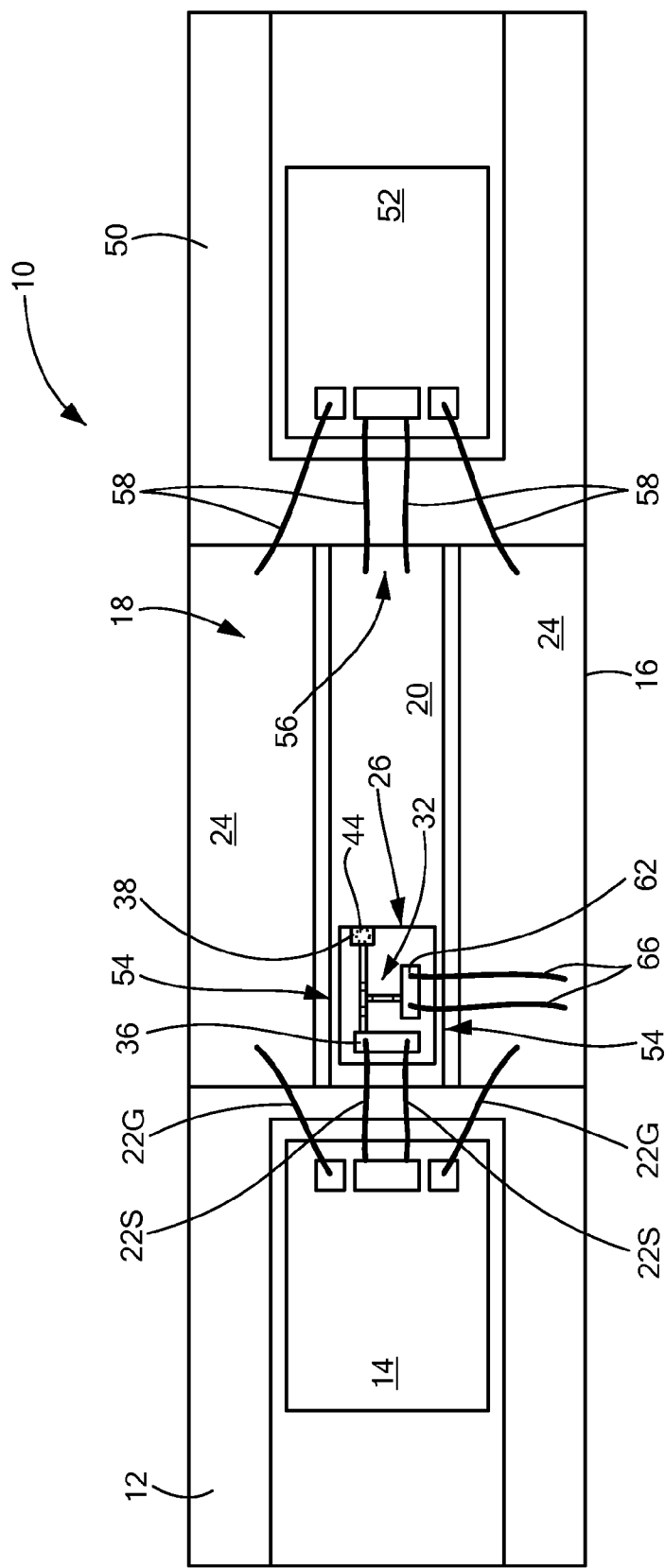
FIG. 2 is plain view of an electrical circuit used to interconnect a pair of amplifies according to the disclosure.

Referring now to FIG. 2, an electrical circuit 10 is shown having: a monolithic microwave integrated circuit 12 having an radio frequency (RF) amplifier 14; a first substrate 16, here for example, Alumina, having a microwave transmission line 18, the microwave transmission line 18, here a coplanar waveguide microwave transmission line having: signal conductor 20, and ground conductors 24 disposed on a surface of the first substrate 16, and the ground conductors 24 connected to the amplifier 14 using air-bridge conductors, 22G; and a pair of. It is noted that at least one of the coplanar ground plane conductors 24 is connected to a circuit ground plane conductor 23 (FIGS. 4 and 5) disposed on the bottom surface of the first substrate 16 through conductive via 25 (FIGS. 2, 4, 6A and 6B) which passes through the first substrate 16 between the coplanar ground plane conductors 24 and the circuit ground plane conductor 23.

Figure 3:
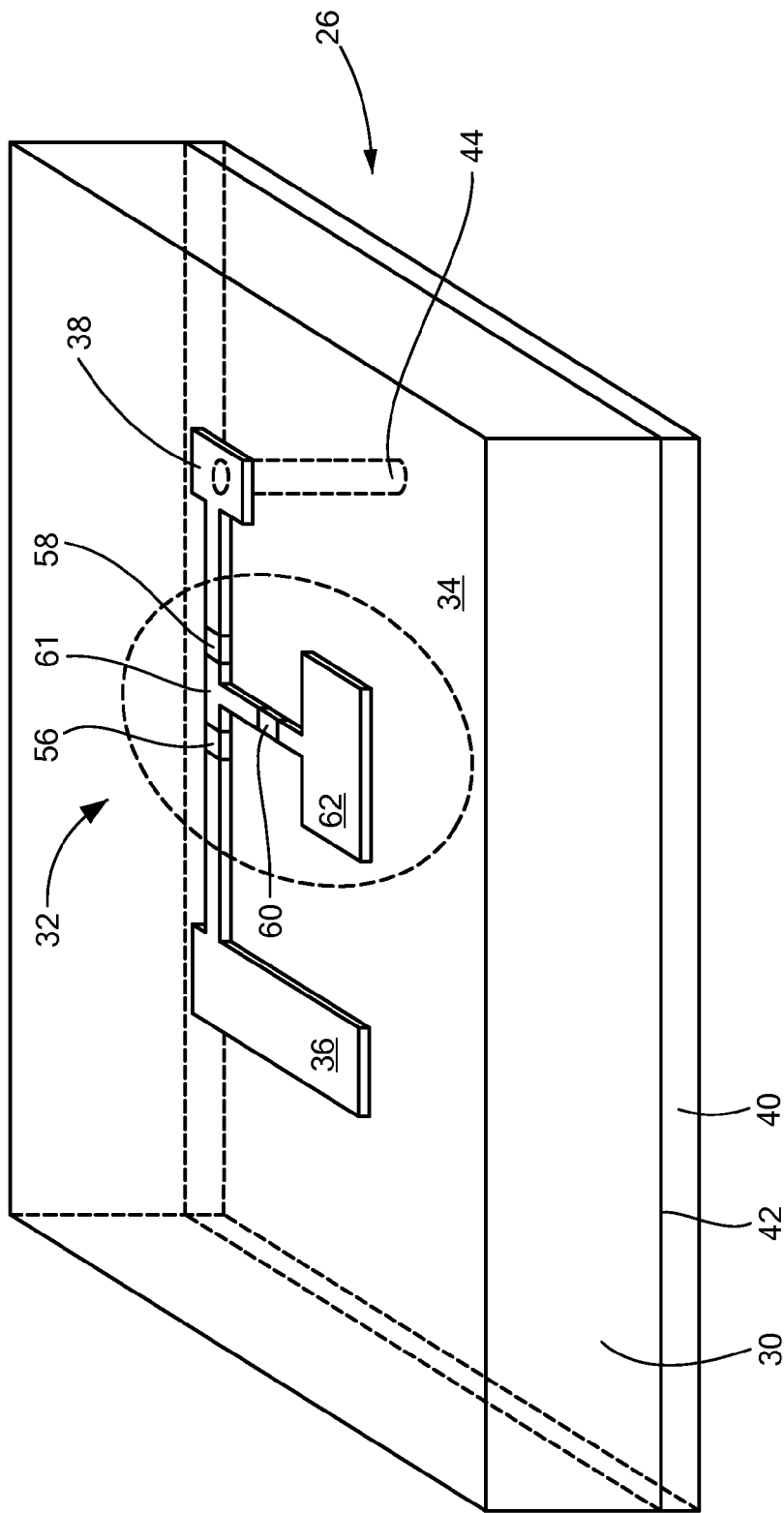
FIG. 3 is an isomeric view of an attenuator module used in the circuit of FIG. 2 according to the disclosure.

The circuit 10 includes an attenuator module 26 shown more clearly in FIGS. 3, 6A and 6B having: second substrate 30, for example, gallium arsenide; an attenuator 32 disposed on one surface, here the upper surface 34, of the second substrate 30, the attenuator having an input terminal 36 at one end of the attenuator and an output terminal 38 at an opposite end of the attenuator 32; an electrical conductor 40 disposed on an opposite, bottom surface 42 of the second substrate 30; an electrically conductive via 44 passing from the output terminal 38 through the second substrate 30 to the electrical conductor 40 disposed on the opposite surface of the second substrate 30. The electrical conductor 40 is disposed on an opposite surface of the second substrate 30 is disposed in electrical contact with the signal conductor 20 (FIG. 2) of the first substrate 16, as shown in FIGS. 2, 6A and 6B.

Figure 4:
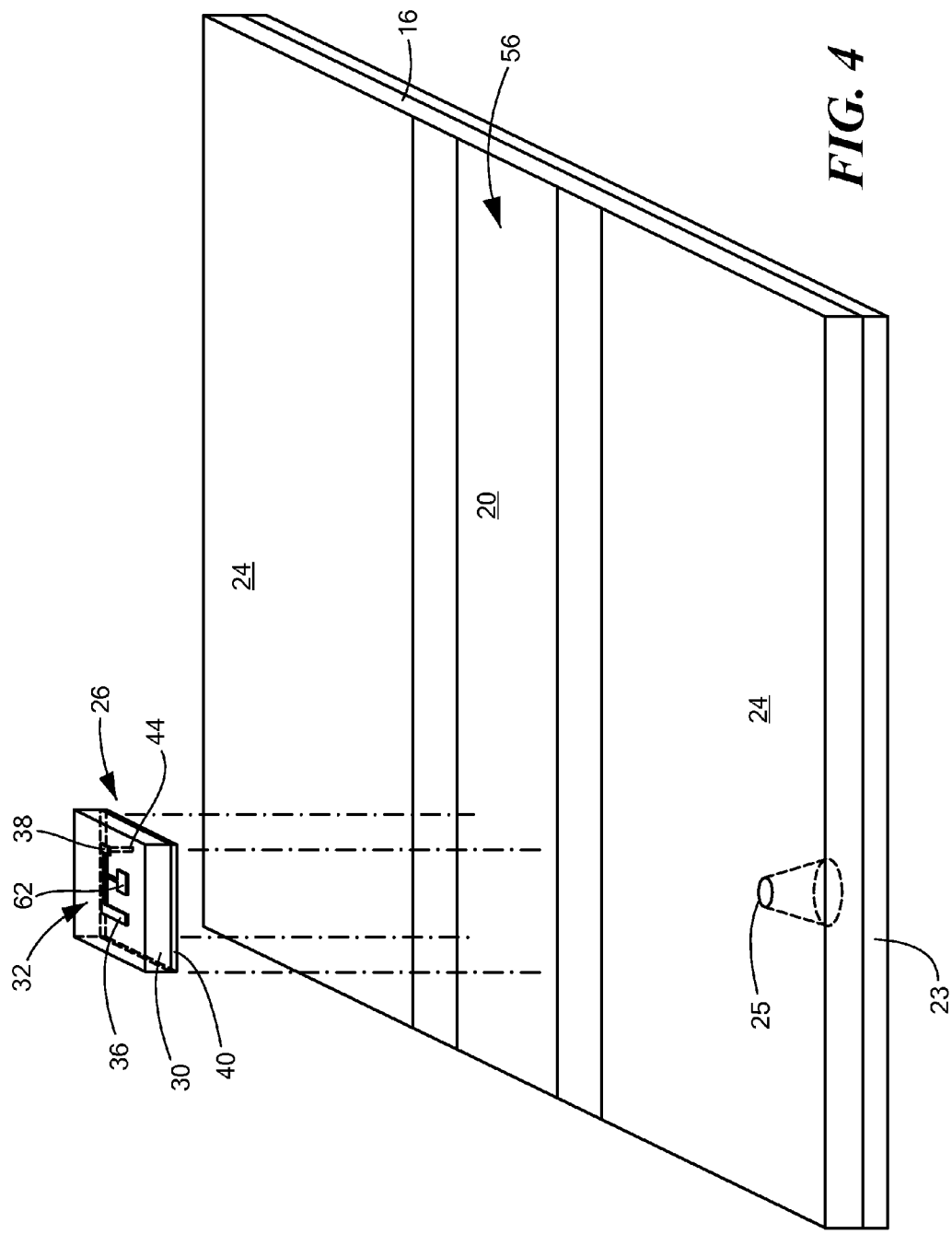
FIG. 4 is an exploded view of a pair of mounted substrates, one of the substrates having the attenuator module of FIG. 3 and the other having microwave transmission line connected to the attenuator module and used to interconnect the amplifiers in the circuit of FIG. 2 according to the disclosure.
Figure 5:
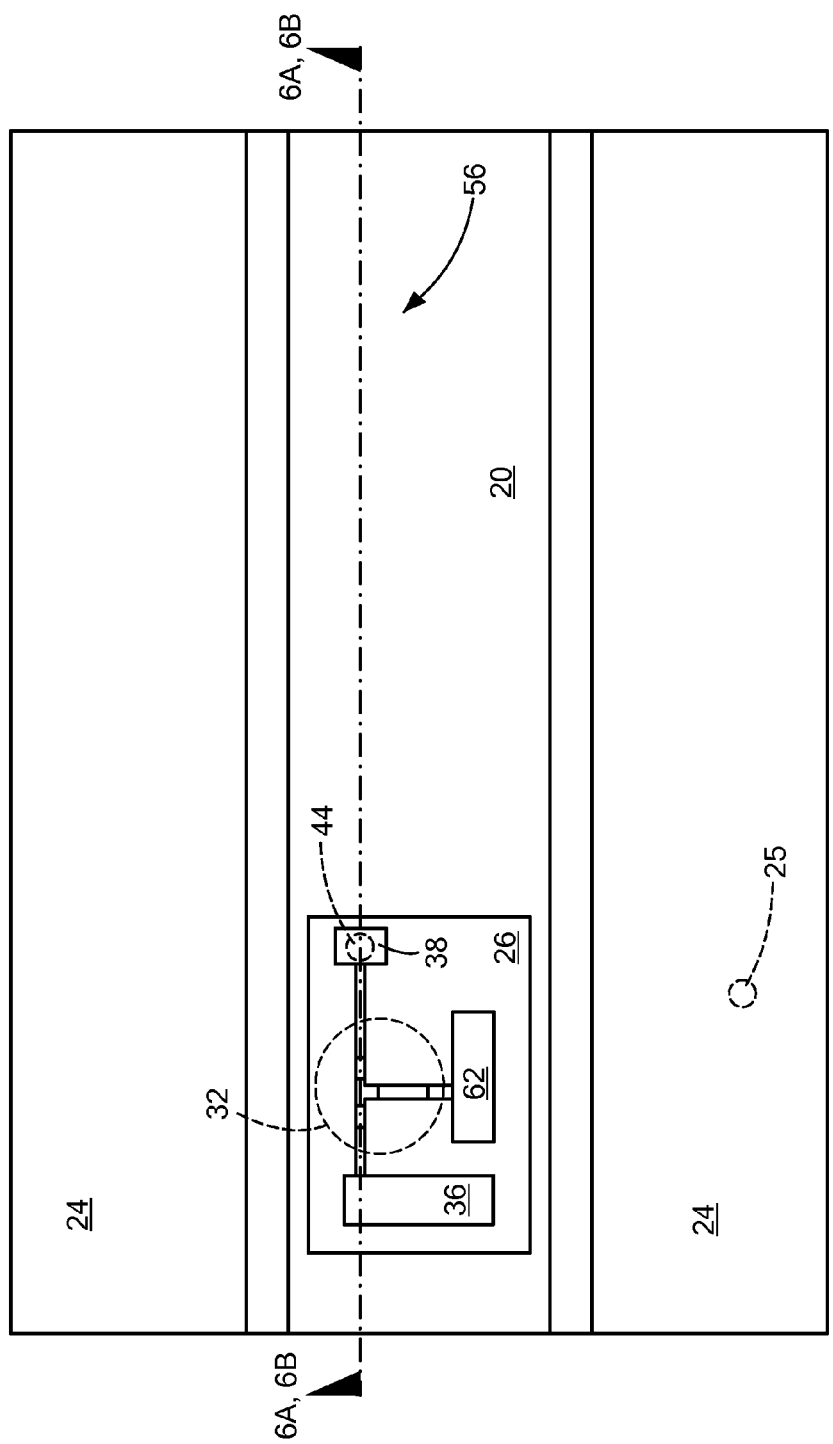
FIG. 5 is a plan view of the attenuator module of FIG. 3 mounted to the microwave transmission line used to interconnect the amplifiers in the circuit of FIG. 2 according to the disclosure.

Referring again to FIG. 2, the electrical circuit 10 including a second monolithic microwave integrated circuit 50 having an amplifier 52 wherein the signal conductor 20 disposed on a surface of the first substrate 16 has: (a) an input end 54 thereof disposed under the input terminal 36, such input terminal 36 being connected to the first-mentioned amplifier 14; and (b) an output end 56 connected to the second amplifier 52; wherein a signal produced by the first amplifier 14 passes to the second amplifier 52 through the a signal path along the signal conductor 20 and through the attenuator 32. More particularly, the signal from amplifier 14 passes to input. 36, through the attenuator 32 to the output 38, then through the conductive via 44 to the bottom conductor 40, then along the signal conductor 20 to the output 56 to the second amplifier 52 using air-bridges 55, 58 similar to the air-bridges 22S, 22G described in connection with amplifier 14, as shown in FIGS. 2 and 4.

Here, as shown more clearly in FIGS. 3, 6A and 6B, the attenuator 32 comprises a pair of attenuator elements 56, 58, here for example, tantalum nitride (TaN) serially connected along the signal path and a shunt attenuator element 60 here for example, tantalum nitride (TaN) connected between a T-shaped terminal 61 between the pair of serially connected attenuator elements 56, 58 and the ground plane connecting pad 62. As shown in FIG. 2, the ground plane connecting pad 62 of attenuator module 26 is connected to one of the pair of ground plane conductors 24 of the coplanar waveguide transmission line using air-bridge conductors 66, as shown in FIG. 2. As noted above, at least one of the coplanar ground plane conductors 24 is connected to a circuit ground plane conductor 23 (FIGS. 4, 6A and 6B) disposed on the bottom surface of the first substrate 16 through a conductive via 25 (FIGS. 4, and 5) which passes through the first substrate 16 between the coplanar ground plane conductors 24 and the circuit ground plane conductor 23.m The attenuator module 26 may be easily installed at different points along the signal path to evaluate the impact to these critical electrical parameters. The attenuator module 26 can be easily removed and replaced to try multiple values and configurations. The results of these tests greatly reduce the risk of error in subsequent iteration of the design. Thus, a method for determining placement of an attenuator module 26 along a signal path on a first substrate having a microwave transmission line, the microwave transmission line having: a signal conductor disposed on a surface of the first substrate to provide the signal path; and a ground plane conductor, comprises: (A) providing an attenuator module 26, comprising: a second substrate; attenuator disposed on one surface of the second substrate, the attenuator having an input terminal at one end of the attenuator and an output terminal at an opposite end of the attenuator; an electrical conductor disposed on an opposite surface of the second substrate; an electrically conductive via passing from the output terminal through the second substrate to the electrical conductor disposal on the opposite surface of the second substrate; wherein the electrical conductor disposed on an opposite surface of the second substrate is disposed in electrical contact with the signal conductor of the first substrate; (B) disposing the attenuator module at a first position along the signal conductor 22 comprising disposing the electrical conductor on the opposite surface of the second substrate at a first position on the signal conductor and attached it using standard conductive epoxy; (C) testing performance of transmission along the signal path through the disposed attenuator module; (D) changing the position of the attenuator module along the signal path if required using standard MMIC rework procedures including localized heat and mechanical force to break the conductive epoxy bond; and (E) re-testing performance of transmission along the signal path through the re-positioned attenuator module.

A number of embodiments of the disclosure have been described. Nevertheless, it will be understood that various modifications may be made without departing from the spirit and scope of the disclosure. For example, other attenuator 32 configurations may be used; other microwave transmission line configurations may be used; and the attenuator module 26 may be used in other applications. Accordingly, other embodiments are within the scope of the following claims.

What is claimed is:

1. An electrical circuit, comprising:
a monolithic microwave integrated circuit having an amplifier;
a first substrate having a microwave transmission line, the microwave transmission line having: a signal conductor disposed on an upper surface of the first substrate and connected to the amplifier through a conductor disposed over the upper surface of the first substrate; and a ground plane conductor;
an attenuator module, comprising:
a second substrate;
an attenuator disposed on an upper surface of the second substrate, the attenuator having an input terminal on the upper surface at one end of the attenuator connected to the conductor disposed over the upper surface of the substrate and an output terminal on the upper surface at an opposite end of the attenuator, the attenuator having an attenuation element disposed between the input terminal and the output terminal;
an electrical conductor disposed on a bottom surface of the second substrate;
an electrically conductive via passing from the output terminal through the second substrate to the electrical conductor disposed on the bottom opposite surface of the second substrate; and
wherein the electrical conductor disposed on the bottom surface of the second substrate is disposed in electrical contact with the signal conductor of the first substrate; and
wherein the input terminal is electrically isolated from the signal conductor of the first substrate.

2. The electrical circuit recited in claim 1 including a second monolithic microwave integrated circuit having an amplifier wherein a signal produced by the first amplifier passes between the input end of the signal conductor to the second amplifier through the attenuator.

3. The electrical circuit recited in claim 2 wherein the microwave transmission line is a coplanar waveguide microwave transmission line wherein the ground plane is disposed on said surface of the first substrate.

4. The electrical circuit recited in claim 3 wherein the attenuator comprises a pair of attenuator elements serially connected along the signal path and a shunt attenuator element connected between a terminal between the pair of serially connected attenuator elements and the ground plane.

5. The electrical circuit recited in claim 1 wherein the microwave transmission line is a coplanar waveguide microwave transmission line wherein the ground plane is disposed on said surface of the first substrate.

6. The electrical circuit recited in claim 5 wherein the attenuator comprises a pair of attenuator elements serially connected along the signal path and a shunt attenuator element connected between a terminal between the pair of serially connected attenuator elements and the ground plane.

7. An electrical circuit, comprising:
a first substrate having a microwave transmission line, the microwave transmission line having: a signal conductor disposed on an upper surface of the first substrate; and a ground plane conductor;
an attenuator module, comprising:
a second substrate;
an attenuator disposed on an upper surface of the second substrate, the attenuator having an input terminal on the upper surface of the second substrate at one end of the attenuator and an output terminal on the upper surface of the second substrate at an opposite end of the attenuator, the attenuator having an attenuation element disposed between the input terminal and the output terminal;
an electrical conductor disposed on a bottom surface of the second substrate;
an electrically conductive via passing from the output terminal through the second substrate to the electrical conductor disposed on the bottom surface of the second substrate; and
a third substrate having a microwave transmission line, the microwave transmission line having: a signal conductor disposed on an upper surface of the third substrate; and a ground plane conductor;
an air-bridge conductor disposed over a portion of the first substrate and a portion of the second substrate to electrically connect the input terminal to the signal conductor disposed on the upper surface of the first substrate; and wherein the electrical conductor disposed on the bottom surface of the second substrate is disposed in electrical contact with the signal conductor of the third substrate.

8. The electrical circuit recited in claim 7 wherein the microwave transmission line is a coplanar waveguide microwave transmission line wherein the ground plane is disposed on said surface of the first substrate.

9. The electrical circuit recited in claim 8 wherein the attenuator comprises a pair of attenuator elements serially connected along the signal path and a shunt attenuator element connected between a terminal between the pair of serially connected attenuator elements and the ground plane.

10. A method for determining placement of an attenuator module along a signal path on a first substrate having a microwave transmission line, the microwave transmission line having: a signal conductor disposed on a surface of the first substrate to provide the signal path; and a ground plane conductor, comprising:

(A) providing an attenuator module, comprising:
    a second substrate;
    an attenuator disposed on an upper surface of the second substrate, the attenuator having an input terminal on the upper surface of the second substrate at one end of the attenuator and an output terminal the upper surface of the second substrate at an opposite end of the attenuator, the attenuator having an attenuation element disposed between the input terminal and the output terminal;
    an electrical conductor disposed on a bottom surface of the second substrate;
    an electrically conductive via passing from the output terminal through the second substrate to the electrical conductor disposed on the bottom surface of the second substrate;
    wherein the electrical conductor disposed on an bottom surface of the second substrate is disposed in electrical contact with the signal conductor of the first substrate; and
wherein the input terminal is electrically isolated from the signal conductor of the first substrate;

(B) positioning the attenuator module at a first position along the signal conductor comprising disposing the electrical conductor on the bottom surface of the second substrate at a first position on the signal conductor;

(C) testing the performance of signal transmission along the signal path through the disposed attenuator module;

(D) re-positioning the attenuator module along the signal path; and (E) re-testing the performance of signal transmission along the signal path through the re-positioned attenuator module.

* * * * *